United States Patent
Inokuma

(10) Patent No.: US 7,952,624 B2
(45) Date of Patent: May 31, 2011

(54) IMAGE PICKUP DEVICE HAVING A COLOR FILTER FOR DIVIDING INCIDENT LIGHT INTO MULTIPLE COLOR COMPONENTS AND IMAGE PROCESSING SYSTEM USING THE SAME

(75) Inventor: Kazuyuki Inokuma, Kyoto (JP)

(73) Assignee: Panasonic Corporation, Osaka (JP)

( * ) Notice: Subject to any disclaimer, the term of this patent is extended or adjusted under 35 U.S.C. 154(b) by 644 days.

(21) Appl. No.: 11/527,681

(22) Filed: Sep. 27, 2006

(65) Prior Publication Data

US 2007/0076105 A1  Apr. 5, 2007

(30) Foreign Application Priority Data

Sep. 30, 2005 (JP) .................. 2005-287281

(51) Int. Cl.
*H04N 3/14* (2006.01)
*H04N 7/18* (2006.01)
(52) U.S. Cl. ............... 348/280; 348/61; 348/273
(58) Field of Classification Search .......... 348/273, 348/278, 280
See application file for complete search history.

(56) References Cited

U.S. PATENT DOCUMENTS

| | | | | |
|---|---|---|---|---|
| 5,063,439 A * | 11/1991 | Tabei | ............ | 348/272 |
| 5,523,811 A | 6/1996 | Wada et al. | | |
| 6,714,243 B1 * | 3/2004 | Mathur et al. | ............ | 348/273 |
| 7,148,920 B2 * | 12/2006 | Aotsuka | ............ | 348/223.1 |
| 7,164,113 B2 * | 1/2007 | Inokuma et al. | ............ | 250/208.1 |
| 7,349,024 B2 * | 3/2008 | Oda et al. | ............ | 348/370 |
| 7,420,607 B2 * | 9/2008 | Ota et al. | ............ | 348/315 |
| 7,612,822 B2 * | 11/2009 | Ajito et al. | ............ | 348/336 |
| 7,852,388 B2 * | 12/2010 | Shimizu et al. | ............ | 348/272 |
| 2002/0158978 A1 * | 10/2002 | Gann et al. | ............ | 348/272 |
| 2003/0176768 A1 * | 9/2003 | Gono et al. | ............ | 600/109 |
| 2004/0100570 A1 * | 5/2004 | Shizukuishi | ............ | 348/272 |
| 2005/0103983 A1 * | 5/2005 | Yamaguchi et al. | ............ | 250/214.1 |
| 2005/0151860 A1 * | 7/2005 | Silverstein et al. | ............ | 348/272 |
| 2005/0212934 A1 * | 9/2005 | Hoshuyama | ............ | 348/272 |
| 2005/0264701 A1 | 12/2005 | Huh et al. | | |
| 2006/0012808 A1 | 1/2006 | Mizukura et al. | | |
| 2006/0082665 A1 * | 4/2006 | Mizukura et al. | ............ | 348/272 |
| 2007/0058055 A1 * | 3/2007 | Yamaguchi et al. | ............ | 348/272 |

FOREIGN PATENT DOCUMENTS

| | | |
|---|---|---|
| CN | 1643936 A | 7/2005 |
| CN | 1666534 A | 9/2005 |
| CN | 2727760 Y | 9/2005 |
| JP | 5-294183 A | 11/1993 |
| JP | 2003-284084 | 10/2003 |
| WO | WO 00/77566 A1 * | 12/2000 |
| WO | WO 2005/069376 A1 | 7/2005 |

OTHER PUBLICATIONS

Chinese Office Action issued in Chinese Patent Application No. 2006101270126, dated Mar. 27, 2009, and English translation.
Japanese Notice of Reasons for Rejection, w/ English translation thereof, issued in Japanese Patent Application No. JP 2005-287281 dated Jan. 25, 2011.

* cited by examiner

*Primary Examiner* — Ngoc-Yen T Vu
(74) *Attorney, Agent, or Firm* — McDermott Will & Emery LLP

(57) ABSTRACT

In a multilayer film filter formed of inorganic dielectric materials, a spacer layer has different thicknesses to form a plurality of color-transmissive filter elements having multiple different spectral characteristics on an image sensor.

5 Claims, 14 Drawing Sheets 305
304
306

FIG.13
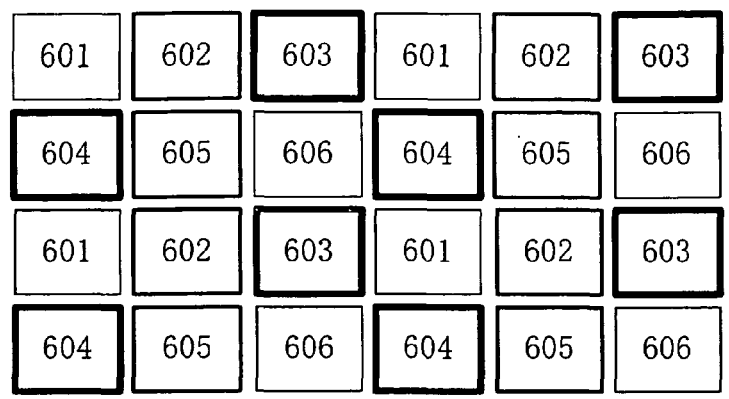
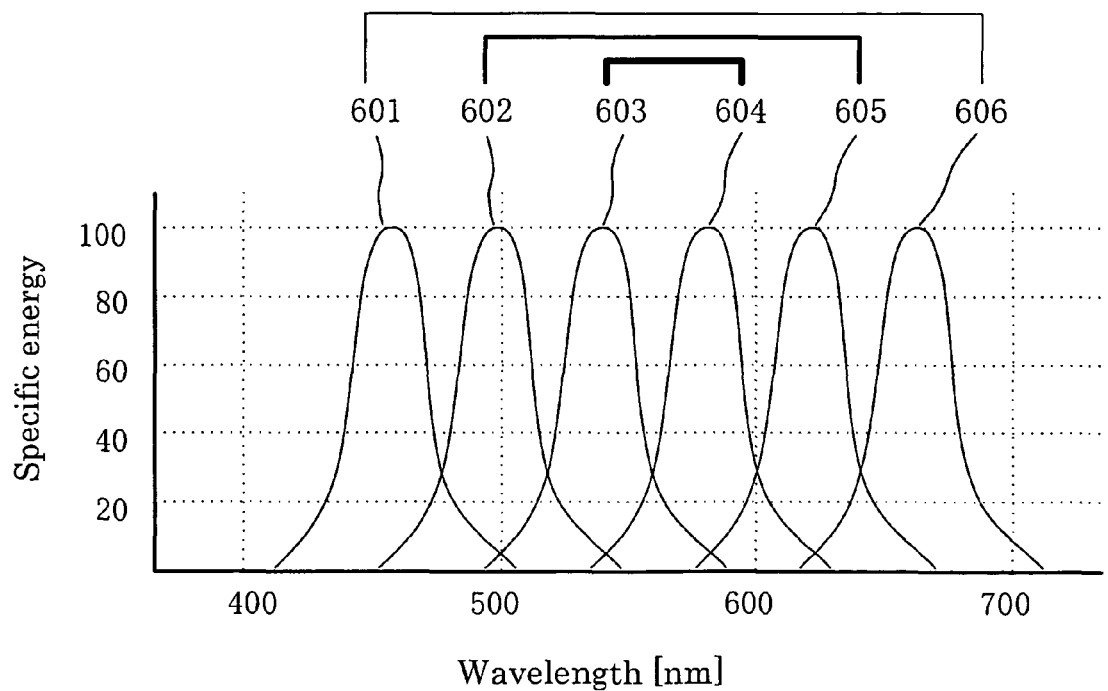
Wavelength [nm]

IMAGE PICKUP DEVICE HAVING A COLOR FILTER FOR DIVIDING INCIDENT LIGHT INTO MULTIPLE COLOR COMPONENTS AND IMAGE PROCESSING SYSTEM USING THE SAME

CROSS-REFERENCE TO RELATED APPLICATION

This application claims priority under 35 USC 119 to Japanese Patent Application No. 2005-287281 filed on Sep. 30, 2005, the entire contents of which are incorporated herein by reference.

BACKGROUND OF THE INVENTION (a) Field of the Invention

This invention relates to image pickup devices and image processing systems for providing excellent images in equipment requiring high reliability and often used under low color rendering lighting, such as vehicle-mounted cameras.

(b) Description of the Related Art

As on-vehicle systems for enhancing the safety of running vehicles, a large number of systems have been conventionally proposed in which a vehicle is equipped with an image pickup means, such as a video camera, to monitor video images around the vehicle.

Specifically, such systems include visual recognition support systems for showing outputs from cameras incorporated in door and side mirror assemblies on a video display placed near the driver's seat in a vehicle to make it possible for the driver to easily check circumstances of an oncoming car and adjacent lanes and side blind spots, and recognition systems for processing a captured video signal to detect movements of surrounding cars and then give the driver an alarm depending upon distance or speed or to scan the specific regions where road signs should exist to recognize them.

The vehicle-mounted cameras used in such on-vehicle systems are required to be insusceptible to climate conditions. For example, Published Japanese Patent Application No. H05-294183 discloses, for the purpose of providing an image pickup device insusceptible to climate conditions, a technique in which the mirrors of door mirror assemblies have a half-mirror surface, the door mirror assemblies contain an optical filter-mounted video lens and an image pickup device, such as a CCD, and a video signal processed by a camera signal processing circuit disposed in the vehicle cabin is output to a video display.

The above Published Japanese Patent Application further describes that the proposed technique also solves the following problems with camera mounting positions: (1) if the camera is disposed in the cabin, this may deteriorate the beauty and comfort of the cabin and narrow the driver's scope; (2) if it is disposed in the engine room, extremely bad surrounding conditions may incur its failures; and (3) if it is disposed on the vehicle exterior, such as on door outside surfaces or the engine room, this has adverse effects on vehicle safety, design and performances such as aerodynamic resistance.

SUMMARY OF THE INVENTION

Though the above known technique provides camera mounting positions where vehicle performances are not deteriorated, it has other problems that the performance of the vehicle-mounted camera is limited. Specifically, the problems are as follows: (1) since the camera takes video images of the vehicle surroundings through the half mirror, its sensitivity is lowered; (2) since the camera mounting position is inside the door mirror assembly, the detectable scope of the camera is limited even if the orientation and field angle of the camera are contrived; and (3) future disuse of door mirrors is under consideration from the design viewpoint and, in that event, the above technique is incapacitated.

Furthermore, though the inside of the door mirror assembly is a better environment of use than the vehicle exterior and the inside of the engine room, the interior of the vehicle parked under the blazing sun in midsummer, notoriously, rises up to very high temperature inclusive of the cabin and the inside of the door mirror assembly. On the other hand, cameras mounted in the engine room and on the vehicle exterior have problems with environment of use, because the engine room inside during cruise has much higher temperature than the cabin and the camera on the vehicle exterior is exposed to direct sunlight.

On-vehicle visual recognition support camera systems aim at enhancing the driver's visibility under adverse conditions, such as at night or in tunnels, compared to that with the naked eye. A large number of road lightings and in-tunnel lightings employ high-pressure sodium lamps for economic reasons. Since, however, high-pressure sodium lamps have poor color rendition, they makes it difficult for the driver to discriminate colors with his naked eye.

FIG. 14 is a cross-sectional view showing the structure of a known image pickup device. As shown in the figure, an image pickup device 1301 includes a silicon semiconductor substrate in which a P-type layer 1303 is laid on an N-type layer 1302 and an interlayer insulation film 1304 is formed on the semiconductor substrate.

In the P-type layer 1303, a plurality of photodiodes 1305 (photoelectric conversion elements) are formed by N-type impurity ion implantation. The photodiodes 1305 are for converting incident light 1306 to electricity. The plurality of photodiodes 1305 are separated by isolation regions 1307 disposed between them.

Further, a light shielding film 1308 for restricting light incidence is formed on each isolation region 1307 and a color filter 1309 is formed above the light shielding film 1308. On the color filters 1309, a condenser lens 1310 is formed for efficiently collecting incident light 1306. The wavelength selectivity of the color filters 1309 provides color separation of incident light 1306 by separating it into respective wavelength regions of R (red), G (green) and B (blue).

Since, however, the known color filters 1309 are made of organic pigment, the pigment cause a chemical change under high-temperature conditions for a long time or by long-time exposure to intensive incident light, resulting in changed wavelength selectivity. Thus, the known image pickup device using the pigment filter has a problem of color degradation due to high temperatures or intensive radiation of light (degraded color separation property). As described above, this problem is more significant for vehicle-mounted image pickup devices. Furthermore, the known color filter has another problem of poor color rendition for lightings used as a large number of road lightings and in-tunnel lightings.

FIG. 15 is a graph showing the spectral characteristics of a high-pressure sodium lamp and the human eye, wherein reference numeral 1401 indicates the spectral characteristic of the high-pressure sodium lamp, reference numeral 1402 indicates the spectral characteristic of the human eye to the blue (B) component of light, reference numeral 1403 indicates the spectral characteristic of the human eye to the green (G) component of light and reference numeral 1404 indicates the spectral characteristic of the human eye to the red (R) component of light.

FIG. 16 is a graph showing the spectral characteristics of the human eye under the illumination of high-pressure sodium lamps, wherein reference numeral 1501 indicates the spectral characteristic to the red (R) component of light and reference numeral 1502 indicates the spectral characteristic of the human eye to the green (G) component of light. Since the spectrum of high-pressure sodium lamps concentrates on the long wavelength side, the human eye under the illumination of high-pressure sodium lamps has almost only a sensitivity to the red light component and, therefore, recognizes all colors as a red or near-red color only. Since conventional cameras also take images using three primary colors of R, G and B near the human eye's spectral characteristics, they likewise recognize all colors as a red or near-red color only.

The present invention has been made with the foregoing in mind and, therefore, its object is to provide an image pickup device that does not deteriorate under the influences of environmental temperatures or direct sunlight even if a camera is mounted anywhere of a vehicle including on the vehicle exterior, in the cabin and in the engine room, and, additionally, exhibits higher visibility under common road lightings than the human eye.

Specifically an image pickup device of the present invention is an image pickup device including an image sensor in which a plurality of unit pixels are arrayed on a chip, wherein the image sensor comprises: photoelectric conversion elements for converting incident light to electricity for each of the unit pixels; and a filter, disposed above the photoelectric conversion elements, for selectively transmitting only a particular wavelength band of the incident light to separate a color component from the incident light, and the filter is a multilayer film filter formed of inorganic materials and configured so that the half width of the particular wavelength band to be selectively transmitted is narrower than 100 nm.

An image processing system of the present invention comprises:

an image sensor in which a plurality of unit pixels are arrayed on a chip, said image sensor comprising a filter for separating incident light into at least four color components;

a conversion section for converting signals corresponding to the at least four color components separated by the image sensor to digital signals, respectively; and an image processing section for processing the signals output from the conversion section to produce color signals.

Since the image pickup device and image processing system of the present invention employ a filter formed of inorganic materials, they do not cause a phenomenon of color degradation due to a chemical change of pigment and can be used under high temperatures and under highly intensive lighting. Therefore, the image pickup device and image processing system can be mounted anywhere of a vehicle, such as on the vehicle exterior, in the cabin or in the engine room.

Furthermore, since the filter structure is configured to change the wavelength band to be transmitted by the filter using thickness differences of the spacer layer sandwiched between a set of upper reflectors and a set of lower reflectors both having the same layered structure, this reduces the number of steps of a semiconductor wafer fabrication process for fabricating an image pickup device, which offers an advantage of the possibility of low-cost mass production.

Moreover, since a plurality of filter elements having multiple different characteristics can be easily formed on the same chip, a large number of filter elements of multiple types each for selectively transmitting only a different particular spectral wavelength band narrower than each of the spectral wavelength bands of three primary colors for the human eye can be formed over the visible wavelength range to cover the entire human visible wavelength range. Therefore, the image pickup device and image processing system of the present invention improves the color discrimination capability under low color rendering lighting compared to the human eye and provides more detailed color information than the human eye.

BRIEF DESCRIPTION OF THE DRAWINGS

FIG. 13 is a diagram showing an exemplarily array of filter elements of the multilayer film filter on the image sensor of the above embodiment.

DETAILED DESCRIPTION OF THE INVENTION

An embodiment of the present invention will be described below in detail with reference to the drawings. The following description of the preferred embodiment is merely illustrative in nature and is not at all intended to limit the scope, applications and use of the invention.

Figure 1:
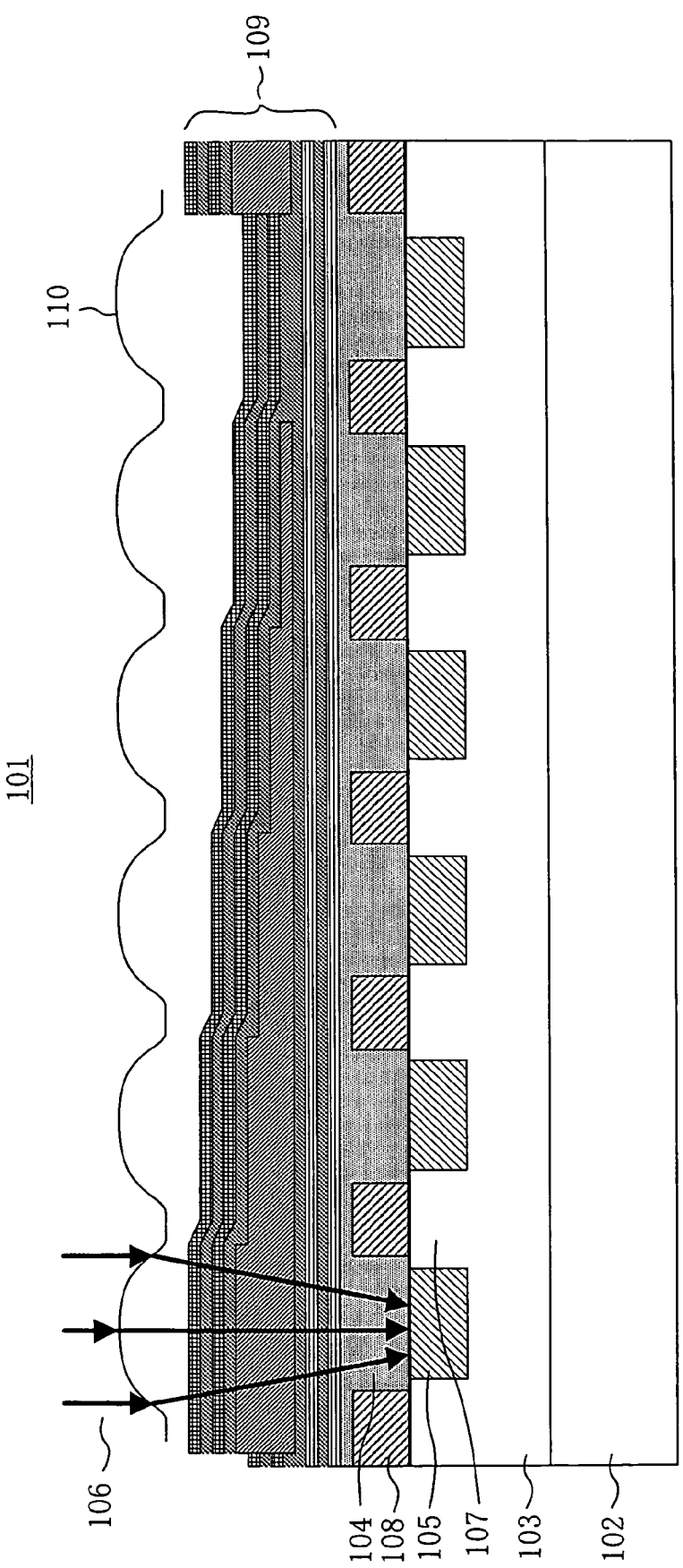
FIG. 1 is a cross-sectional view showing the structure of an image sensor in an image pickup device according to an embodiment of the invention.

FIG. 1 is a cross-sectional view showing the structure of an image sensor in an image pickup device according to the embodiment of the invention. As shown in the figure, an image sensor 101 includes a silicon semiconductor substrate in which a P-type layer 103 is laid on an N-type layer 102 and an interlayer insulation film 104 is formed on the semiconductor substrate.

In the P-type layer 103, a plurality of photodiodes 105 (photoelectric conversion elements) are formed by N-type impurity ion implantation. The photodiodes 105 are for converting incident light 106 to electricity. The plurality of photodiodes 105 are separated by isolation regions 107 disposed between them.

Further, a light shielding film 108 for restricting light incidence is formed on each isolation region 107. Formed on the light shielding films 108 is a multilayer film filter 109 which is made of dielectric materials and provides wavelength selection function. On the multilayer film filter 109, a condenser lens 110 is formed for efficiently collecting incident light 106.

Figure 2:
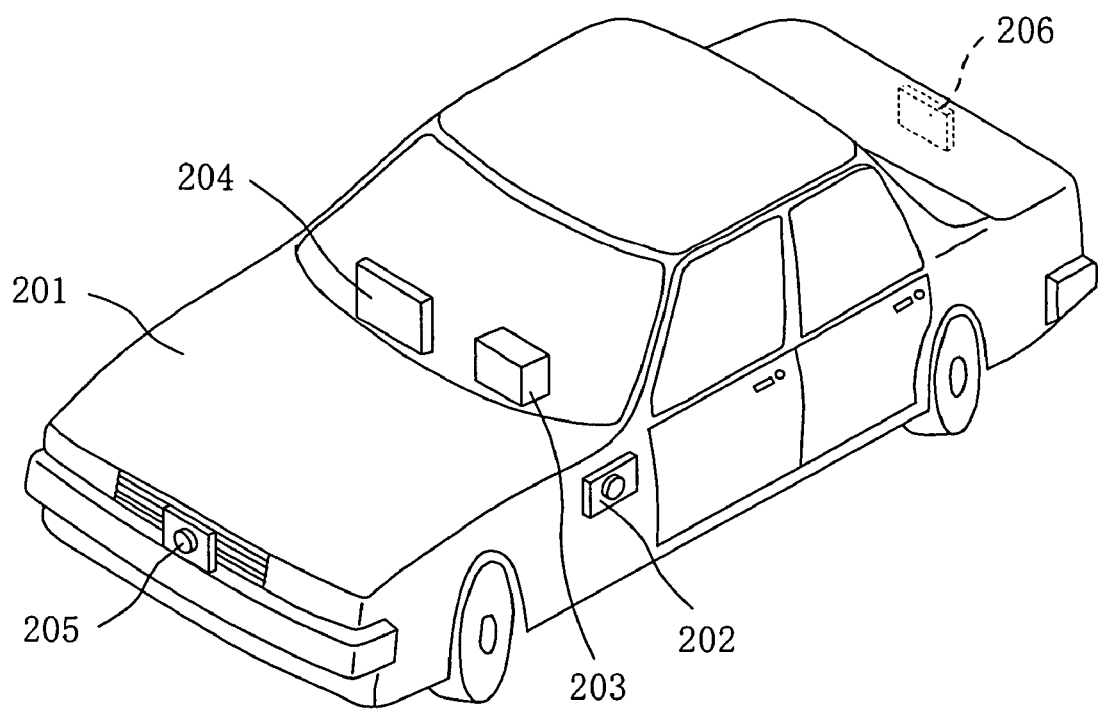
FIG. 2 illustrates a state that image pickup devices according to the embodiment are disposed on a vehicle.

FIG. 2 illustrates a state that image pickup devices according to this embodiment are disposed on a vehicle. As shown in the figure, from the design viewpoint, neither fender mirror assembly nor door mirror assembly is attached to a vehicle 201. Instead of this, side cameras 202 are mounted on the vehicle body sides. Video signals from the side cameras 202 are input to an video controller 203 in a console and output signals from the video controller 203 are shown on a video display 204 placed in the vicinity of the driver's seat in the cabin.

The video controller 203 also receives output signals from a front camera 205 mounted on the vehicle front and a rear camera 206 mounted on the vehicle rear, and allows the video display 204 to show video signals from the side cameras 202, front camera 205 and rear camera 206 selectively or all together.

Since the cabin and the inside of the engine room have a characteristic that cameras therein are more likely to be protected in the event of an accident such as a collision than those on the vehicle exterior, an in-cabin camera or a camera in the engine room both not shown may be used to monitor the outside. In particular, such a camera is effective when used as a on-vehicle black box for recording video images before and after a collision in a traffic accident.

Though not shown in FIG. 2, the image pickup device shown in FIG. 1 is incorporated in each of the side cameras 202, front camera 205 and rear camera 206.

Next, a description is given of the transmittance characteristics of the multilayer film filter according to this embodiment as compared to those of a conventional multilayer film filter.

Figure 3A:
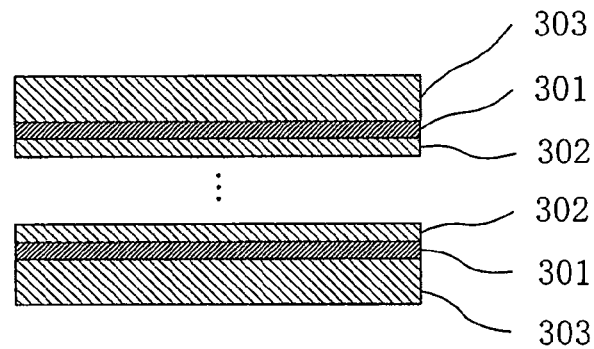
FIG. 3A is a diagram showing the layered structure of a conventional multilayer film filter and FIG. 3B is a graph showing the transmittance characteristics of the conventional multilayer film filter.
Figure 3B:
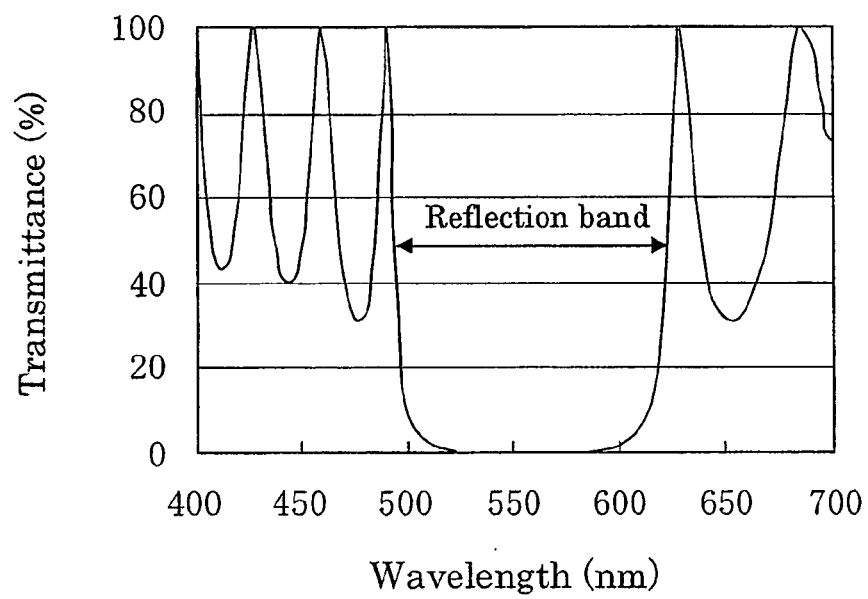

FIG. 3A is a diagram showing the layered structure of a conventional multilayer film filter that is a multilayer film reflector used for a high-reflection mirror and FIG. 3B is a graph showing the transmittance characteristics of the conventional multilayer film filter.

As shown in FIG. 3A, the layered structure of the multilayer film filter is formed of a stack obtained by simply depositing materials of different refractive indices, i.e., silicon nitride (SiN) 301 and silicon dioxide ($SiO_2$) 302 and 303.

In FIG. 3B, the ordinate indicates the transmittance of light having passed through the multilayer film with respect to incident light and the abscissa indicates the wavelength of incident light to the multilayer film. The calculation of transmittances was carried out by a matrix method using Fresnel factors, wherein the number of matrix pairs was 10, the set central wavelength was 550 nm and only vertical incident light was calculated.

In this case, the optical thickness nd (n: the refractive index of the material, d: the thickness thereof) of each of dielectric materials forming the multilayer film is set so that each dielectric material have a quarter wavelength ($\lambda/4$) with respect to the set central wavelength $\lambda$. As a result, the multilayer film exhibits a reflection band characteristic centering on the set central wavelength. Further, the width of the reflection band is determined by the refractive index difference between materials used. Specifically, greater refractive index difference provides wider reflection bandwidth.

Though the above layered structure provides a wide anti-reflection band, it can be said to be difficult to selectively transmit a particular wavelength of incident light in order to perform the color separation function of separating the light into R, G and B.

Figure 4A:
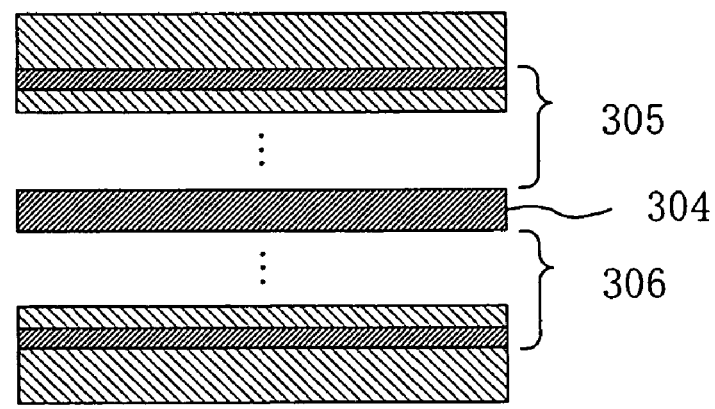
FIG. 4A is a diagram showing the layered structure of a multilayer film filter in the embodiment and FIG. 4B is a graph showing the transmittance characteristics of the multilayer film filter in the above embodiment.
Figure 4B:
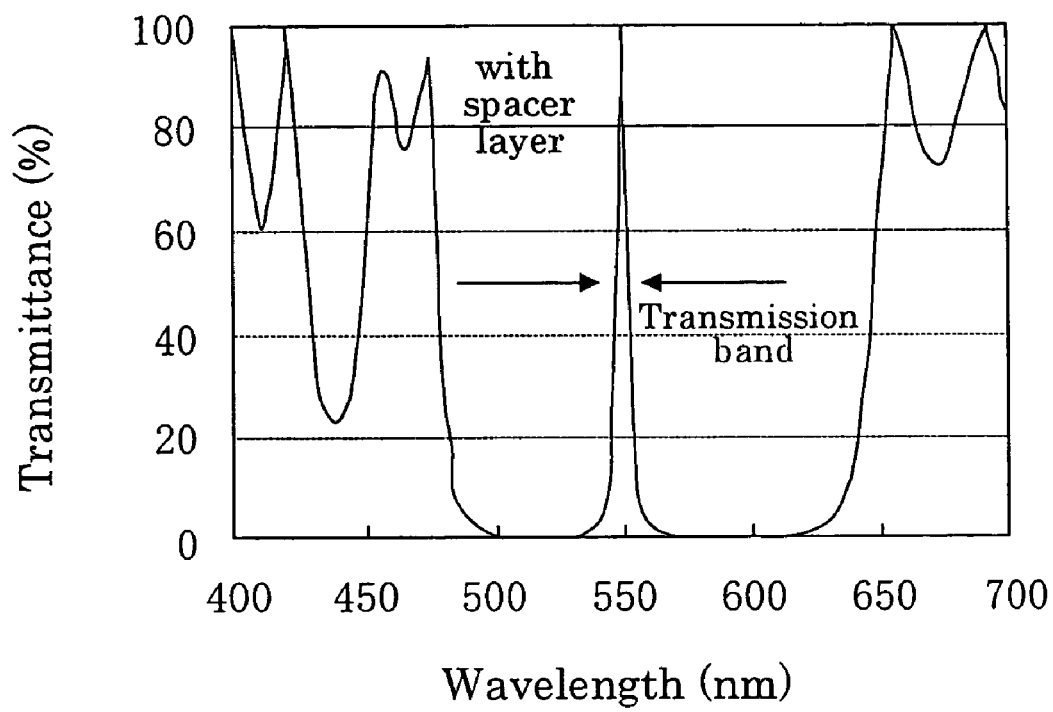

FIG. 4A is a diagram showing the layered structure of a multilayer film filter of this embodiment that is a color separation filter used for a high-reflection mirror and FIG. 4B is a graph showing the transmittance characteristics of the multilayer film filter of this embodiment.

As shown in FIG. 4A, the multilayer film filter of this embodiment has a structure in which a set of upper reflectors 305 and a set of lower reflectors 306, each set forming a $\lambda/4$ multilayer structure ($\lambda$: set central wavelength), are arranged symmetrically with respect to a spacer layer 304 interposed therebetween. This layered structure enables selective formation of a transmission band in the reflection band. Further, the transmission peak wavelength of the transmission band in the reflection band can be changed by changing the thickness of the spacer layer 304.

FIG. 5 is a diagram showing a fabrication process of the multilayer film filter of this embodiment. First, as shown in FIG. 5A, using a high-frequency sputtering device, lower reflectors 402 to 405 alternately made of silicon dioxide ($SiO_2$) and titanium dioxide ($TiO_2$) and having a $\lambda/4$ multilayer structure ($\lambda$: set central wavelength) and a spacer layer 406 made of $TiO_2$ are formed on a Si wafer 401. Then, in order to selectively transmit only a particular wavelength, an etching process is carried out to form the spacer layer 406 into a desired thickness.

Figure 5A:
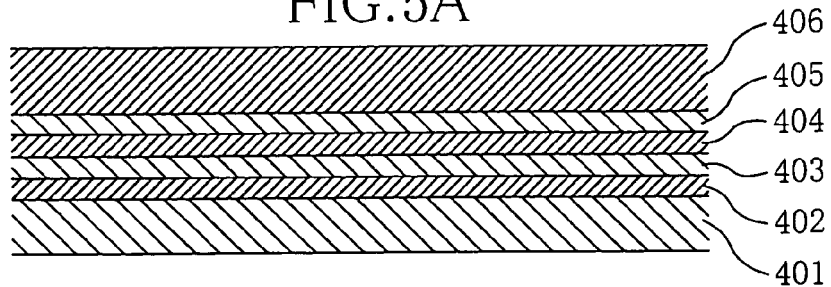
FIG. 5 is a diagram showing a fabrication process of the multilayer film filter in the above embodiment.
Figure 5B:
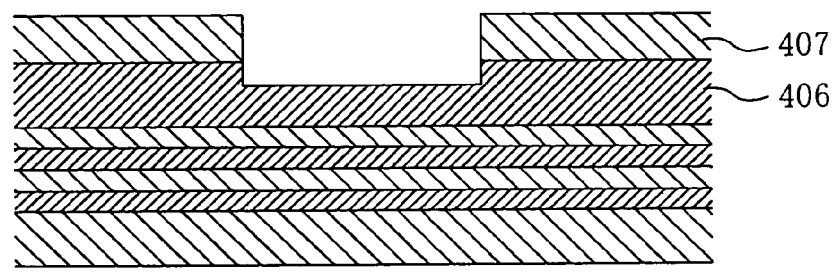

Specifically, as shown in FIG. 5B, photo resist is applied to the surface of the wafer on which the lower reflectors and the spacer layer 402 to 406 are formed. Then, the photo resist is subjected to pre-exposure baking (pre-baking), exposed to light by a photolithography machine such as a stepper, developed and subjected to final baking (post-baking), thereby forming a resist pattern 407. Thereafter, using a CF4-based etching gas, the spacer layer 406 is finally etched until the middle part of the layered structure shown in FIG. 5B has a thickness transmitting the red (R) waveband.

Figure 5C:
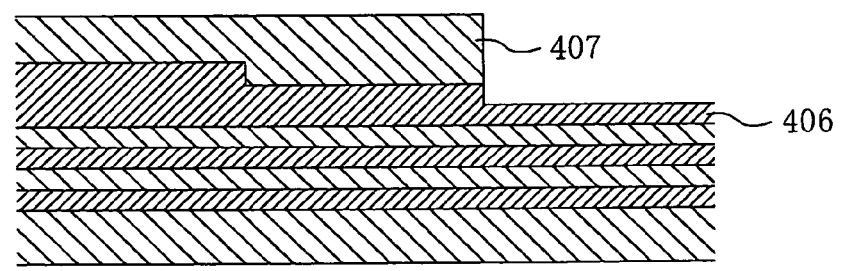

Next, as shown in FIG. 5C, a resist pattern is formed in a wafer surface region corresponding to a region for transmitting the green (G) waveband in the same manner as in FIG. 5B, and the spacer layer 406 is etched away by dry etching until the right-hand part of the layered structure shown in FIG. 5C has a thickness transmitting the green waveband.

Figure 5D:
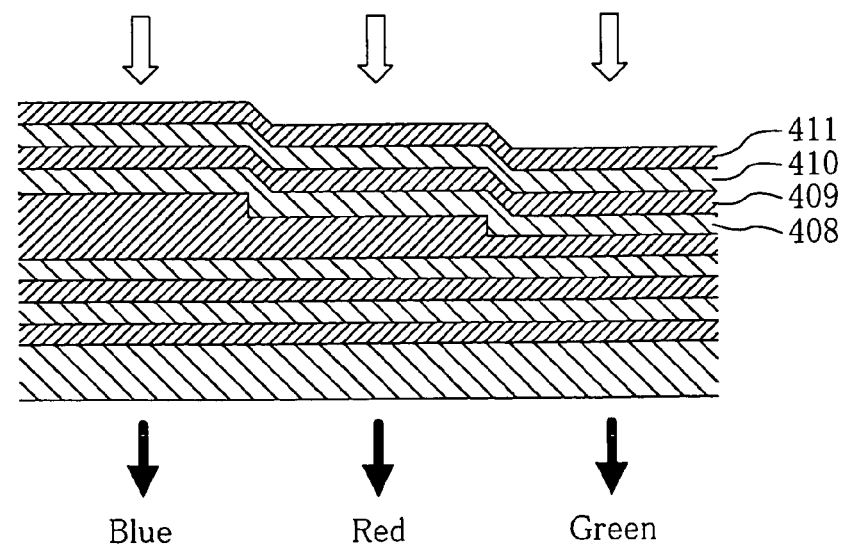

Furthermore, as shown in FIG. 5D, using the high-frequency sputtering device, upper reflectors 408 to 411 alternately made of silicon dioxide ($SiO_2$) and titanium dioxide ($TiO_2$) and having a $\lambda/4$ multilayer structure are formed on the upper reflectors in the same manner as in FIG. 5A.

In the fabrication process, the three parts of the multilayer film structure made of dielectric materials were set to have total thicknesses of 562 nm, 542 nm and 622 nm for the R, G and B, respectively.

Figure 6:
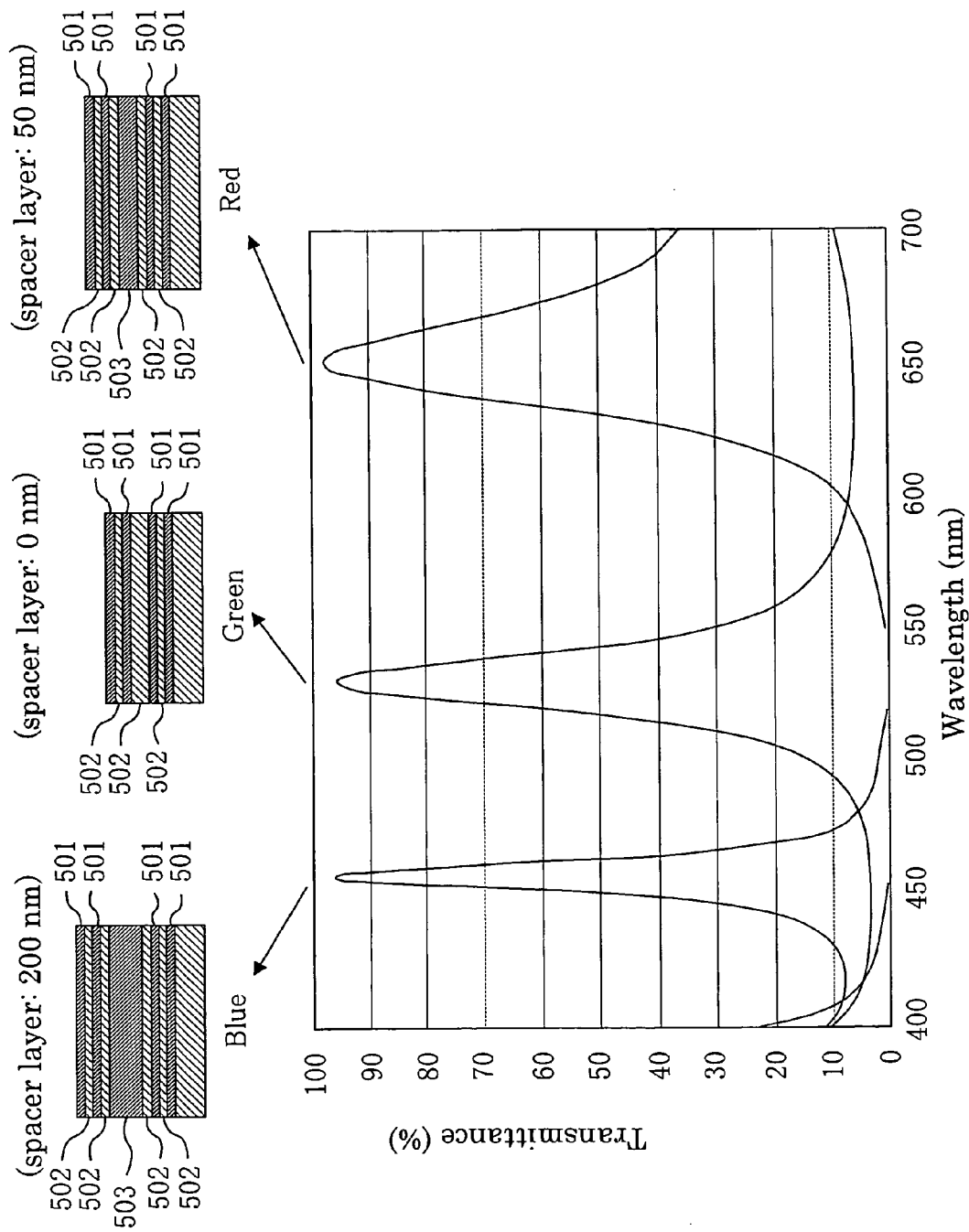
FIG. 6 is a graph showing calculation results on transmittances of the multilayer film filter in the above embodiment.

FIG. 6 is a graph showing calculation results on transmittances of the multilayer film structure of this embodiment, wherein the ordinate indicates the transmittance of light having passed through the multilayer film with respect to incident light and the abscissa indicates the wavelength of incident light to the multilayer film. The calculation of transmittances was carried out using the characteristic matrix method commonly known.

The dielectric materials used were titanium dioxide $TiO_2$ 501 (refractive index: 2.5) serving as a high-refractive index material and silicon dioxide $SiO_2$ 502 (refractive index: 1.45) serving as a low-refractive index material. Further, the spacer layer 503 used were set to have optical thicknesses (physical thicknesses) of 200 nm (80 nm), 0 nm (0 nm) and 50 nm (20 nm).

As seen from FIG. 6, the transmission peak wavelength characteristics can be changed depending upon the existence or absence of the spacer layer 503 and the change of thickness thereof). This provides wavelength separation into R, G and B components which is needed for image pickup devices.

Though in this embodiment titanium dioxide $TiO_2$ is used as a high-refractive index material, other high-refractive index materials may be used and such materials include silicon nitride (SiN), tantalum oxide ($Ta_2O_5$) and zirconium dioxide ($ZrO_2$). Though in this embodiment silicon dioxide $TiO_2$ is used as a low-refractive index material, other materials may be used so long as they have lower refractive indices than the dielectric material used as a high-refractive index material.

As seen from the above, according to the dielectric multilayer film structure of the present invention, a filter can be fabricated by a common semiconductor fabrication process and, unlike the conventional pigment filter, there is no need to fabricate filters by a so-called on-chip process different from the common semiconductor fabrication process after the formation of a photo acceptance element and interconnection of an image pickup device. Therefore, advantageous effects can be obtained in providing cost reduction owing to stable fabrication process and improved productivity.

Furthermore, since the dielectric multilayer film filter of the present invention can be formed of inorganic materials only and, therefore, does not cause color degradation even when used under high temperatures and under intensive light radiation, an image pickup device using the dielectric multilayer film filter of the present invention can be mounted as vehicle-mounted equipment anywhere of a vehicle, such as on the vehicle exterior, in the engine room or in the cabin.

Figure 7:
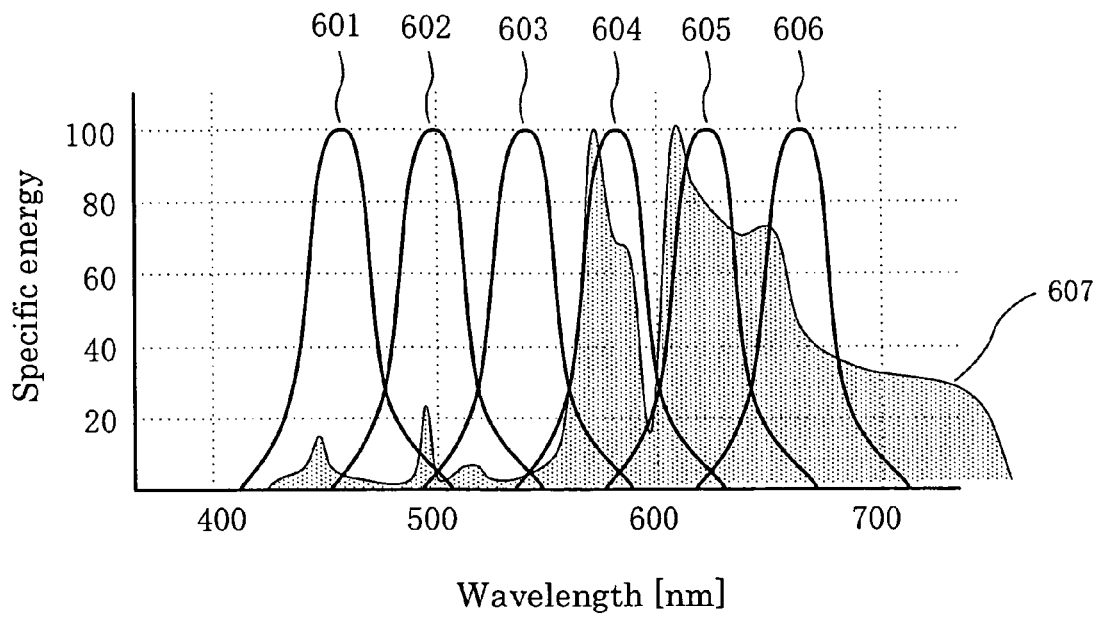
FIG. 7 is a graph showing the spectral characteristics of the multilayer film filter formed on the image sensor in the image pickup device of the above embodiment.

FIG. 7 shows the spectral characteristics of a multilayer film filter formed on the image sensor in the image pickup device of this embodiment. Referring to the graph of FIG. 7, six types of filter elements having different spectral characteristics denoted at 601 to 606 are formed on the image sensor. The filter elements 601 to 606 each have a spectral bandwidth (half width) of approximately 40 nm, which is selected to be narrower than the spectral bandwidth of the human eye, i.e., 80 nm to 100 nm.

In the graph, reference numeral 607 denotes the spectral characteristic of a high-pressure sodium lamp that is a typical road lamp. The human eye and conventional cameras can obtain almost only information on the red component of the lamp. Therefore, it is difficult for them to discriminate colors under high-pressure sodium lamp illumination.

Figure 8:
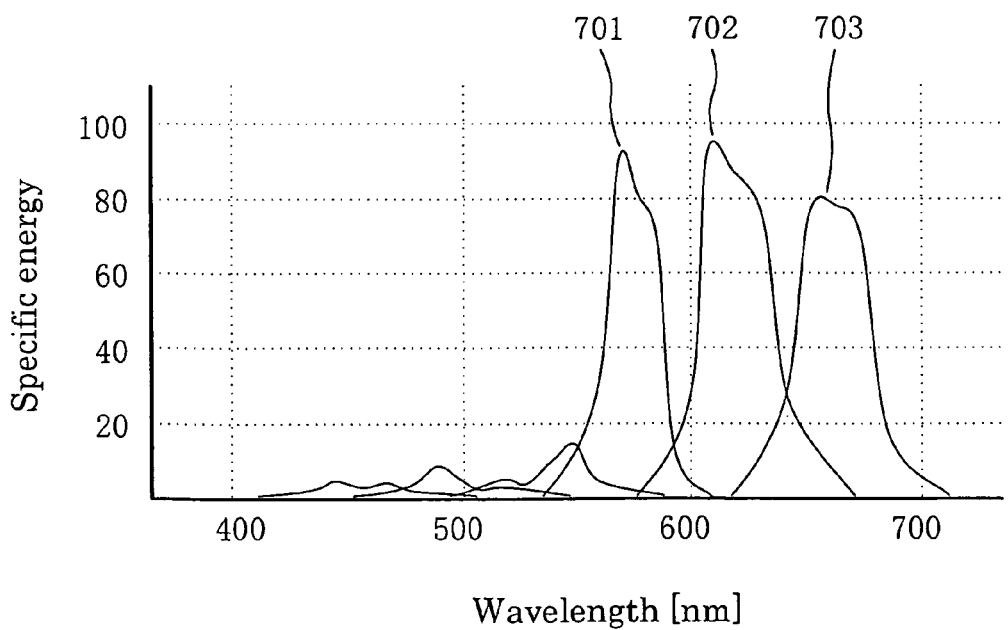
FIG. 8 is a graph showing the spectral characteristics of the image pickup device of the above embodiment under the illumination of high-pressure sodium lamps.

FIG. 8 shows the spectral characteristics of the image pickup device of this embodiment of the invention under high-pressure sodium lamp illumination. As can be seen from the figure, the image pickup device of the present invention can obtain a plurality of pieces of color information as denoted at 701 to 703 even under high-pressure sodium lamp illumination and, therefore can discriminate colors.

When the obtained pieces of color information are shown to human, it is necessary to show them as being converted into conventional RGB formats discriminable to the human eye. The most preferable way to do so is to reproduce colors of the object as colors under white lighting. Since, however, almost no information on the blue to green components can be obtained, the object colors must be estimated from information on the red component. In the case of the conventional filter, the number of pieces of information on the red component obtained is singular, which makes it very difficult to estimate the blue to green components. In contrast, in the present invention, the number of pieces of information on the red component obtained is plural. Therefore, according to the present invention, the spectral pattern of the object can be derived from the obtained pieces of information and colors under white lighting can be estimated to some extent.

Figure 9:
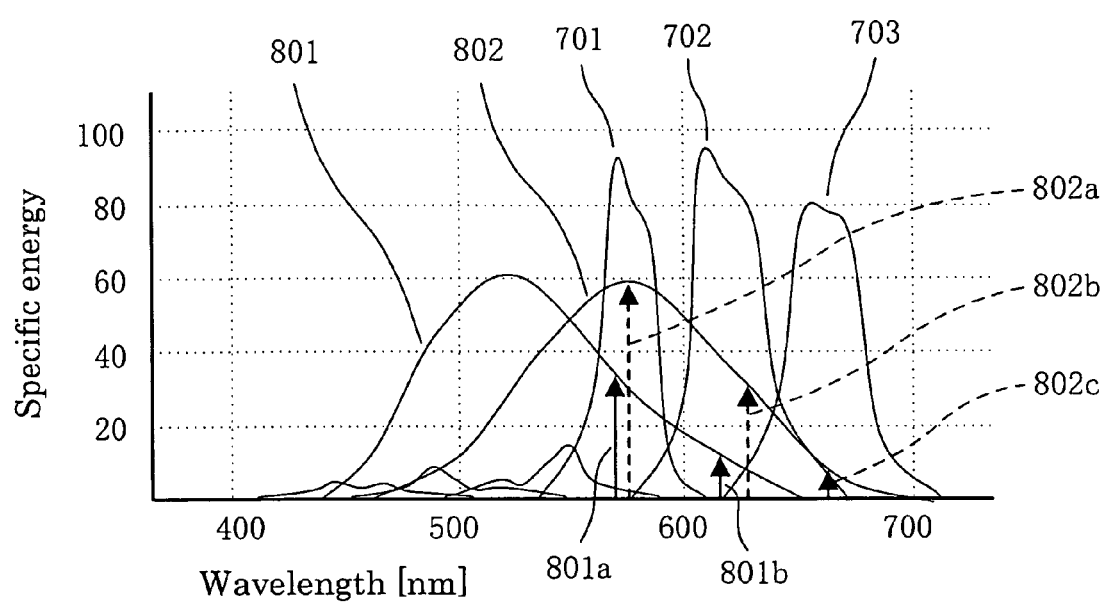
FIG. 9 is a graph showing object color information obtained from the image pickup device of the above embodiment under the illumination of high-pressure sodium lamps.

FIG. 9 is a graph showing object color information obtained from the image pickup device of this embodiment under high-pressure sodium lamp illumination, wherein reference numeral 801 denotes the spectral characteristic of an object A under white lighting and reference numeral 802 denotes the spectral characteristic of an object B under the same white lighting.

In the image pickup device of the present invention, when it takes images of the objects A and B under high-pressure sodium lamp illumination, pieces of color information 801a and 801b can be obtained for the object A while pieces of color information 802a, 802b and 802c can be obtained for the object B.

Thus, according to the present invention, information on parts of the spectral pattern of each of the object A and B can be obtained. More specifically, in conventional cameras, since a single piece of information on the red component can be obtained, no information on the spectral pattern cannot be derived from the obtained information. In contrast, according to the present invention, the spectral characteristic under white lighting can be derived from obtained pieces of information on parts of the spectral pattern.

Figure 10:
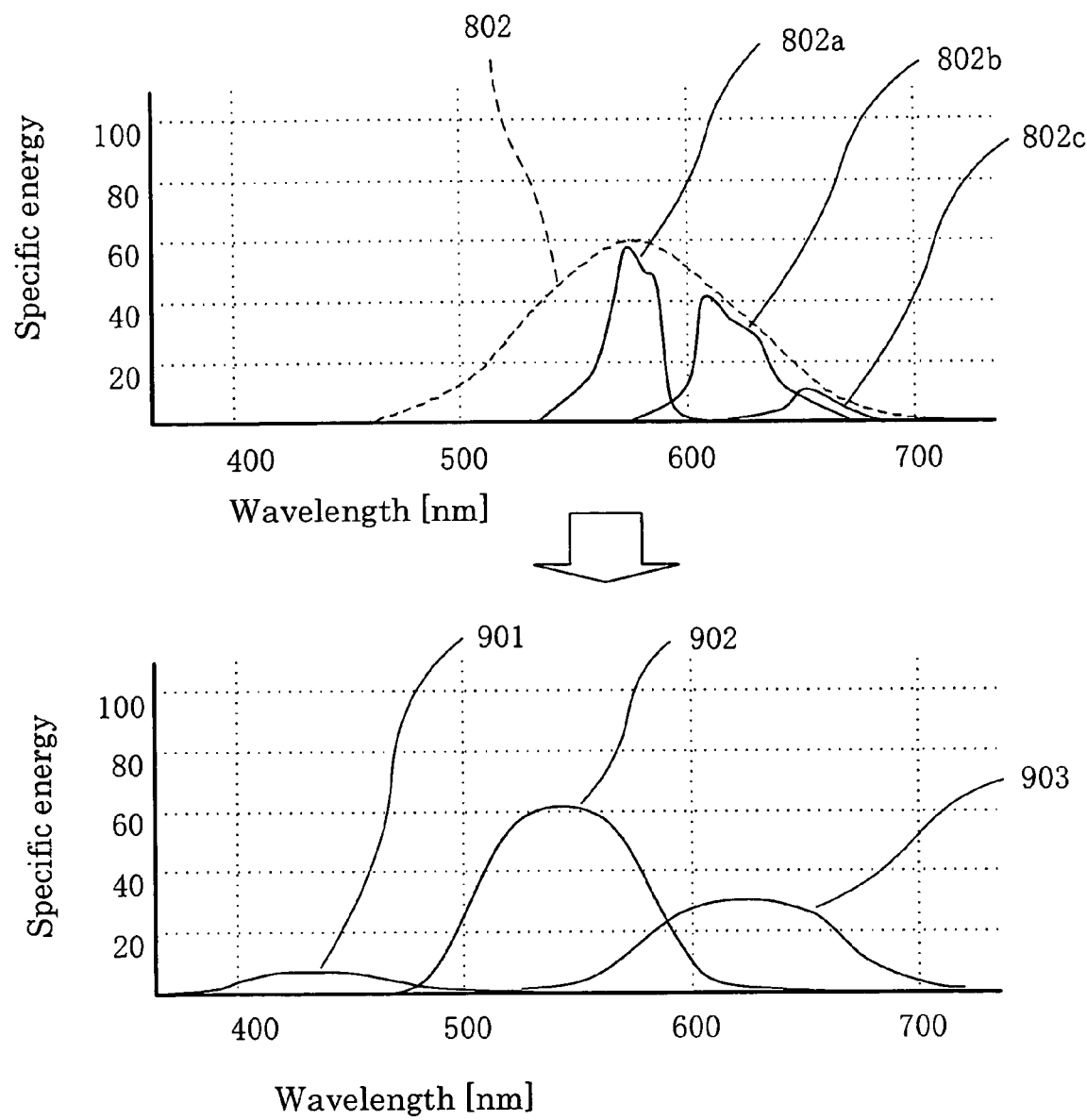
FIG. 10 is a graph showing results of color information under white lighting estimated by the image pickup device of the above embodiment.

FIG. 10 is a graph showing results of color information under white lighting estimated by the image pickup device of this embodiment, wherein reference numeral 802a, 802b and 802c denote respective pieces of color information on the object B under high-pressure sodium lamp illumination.

In this case, based on color information within a narrower range than the human visible wavelength range of 400 nm to 700 nm, a spectrum 802 of the object B under white lighting is derived. Next, the derived spectrum 802 is converted to conventional R, G and B signals (color signals over the entire visible wavelength range) discriminable to the human eye, thereby obtaining a B component 901, a G component 902 and an R component 903, respectively.

As a practical color information estimation method, it can be considered to previously prepare a conversion table for outputting a set of converted signals 901, 902 and 903 directly from a set of pieces of color information 802a 802b and 802c. An example of a method for preparing such a pattern table is to collect characteristics of an actual object and statistically derive conversion data from them. A description is given below of the pattern table preparation method.

Figure 11:
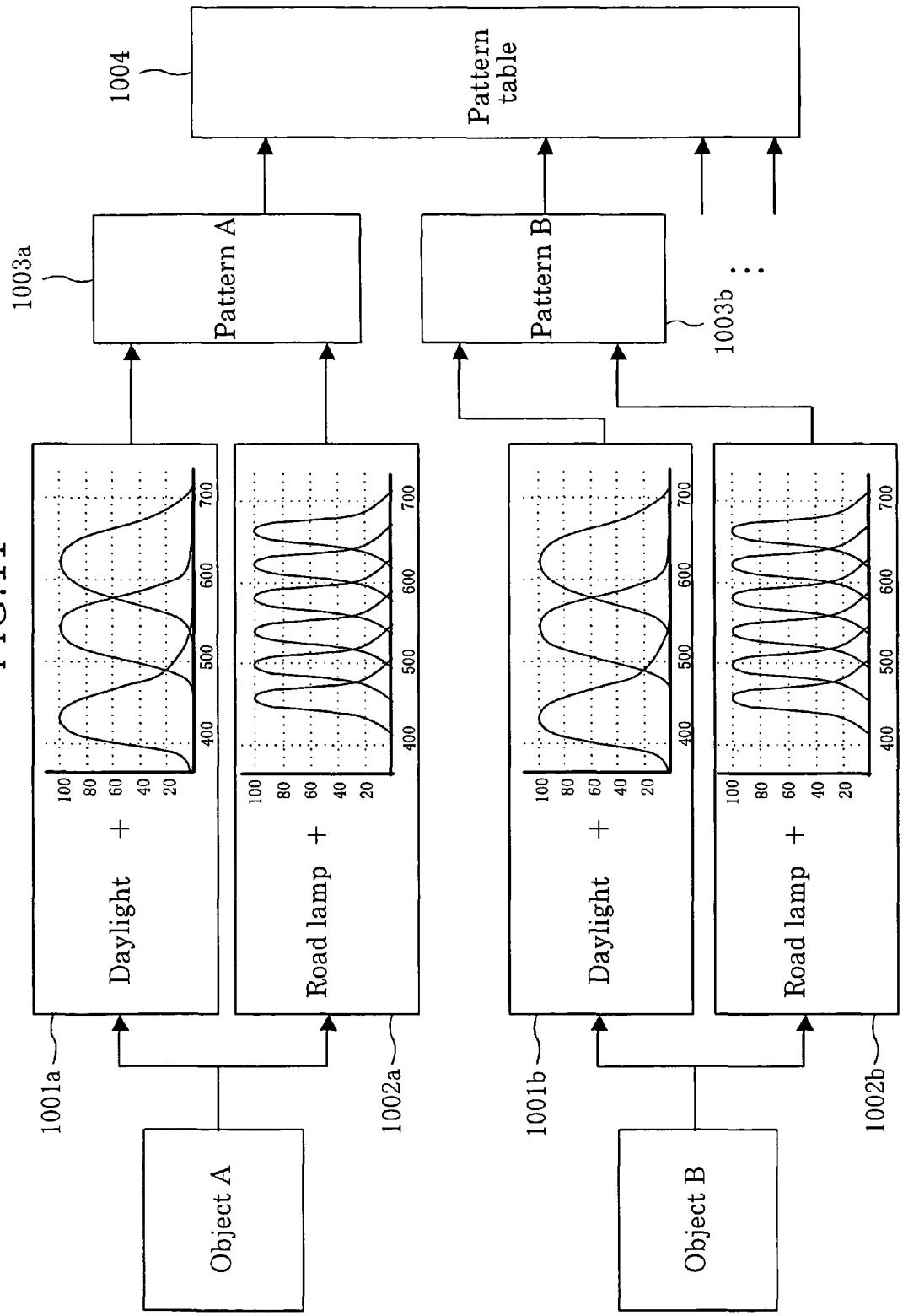
FIG. 11 is a diagram showing a pattern table preparation method for the image pickup device of the above embodiment.

FIG. 11 is a diagram showing the pattern table preparation method for the image pickup device of this embodiment. Referring to FIG. 11, in the image pickup device, color information on an object is obtained based on two different methods. Specifically, the first method is, as shown at 1001a and 1001b in the figure, a method in which the object is taken by a camera having spectra according to the spectral characteristics of the human eye under white lighting, while the second method is, as shown at 1002a and 1002b in the figure, a method in which the object is taken by the image pickup device of the present invention under high-pressure sodium lamp illumination.

Using the above two image pickup methods, pieces of pattern data 1003a, 1003b, . . . on color information are collected for a large number of objects. From the collected data, a pattern table 1004 is prepared which associates inputs (pieces of color information within a narrower range than the human visible wavelength range (400 nm to 700 nm)) with outputs (color signals over the entire visible wavelength range).

Figure 12:
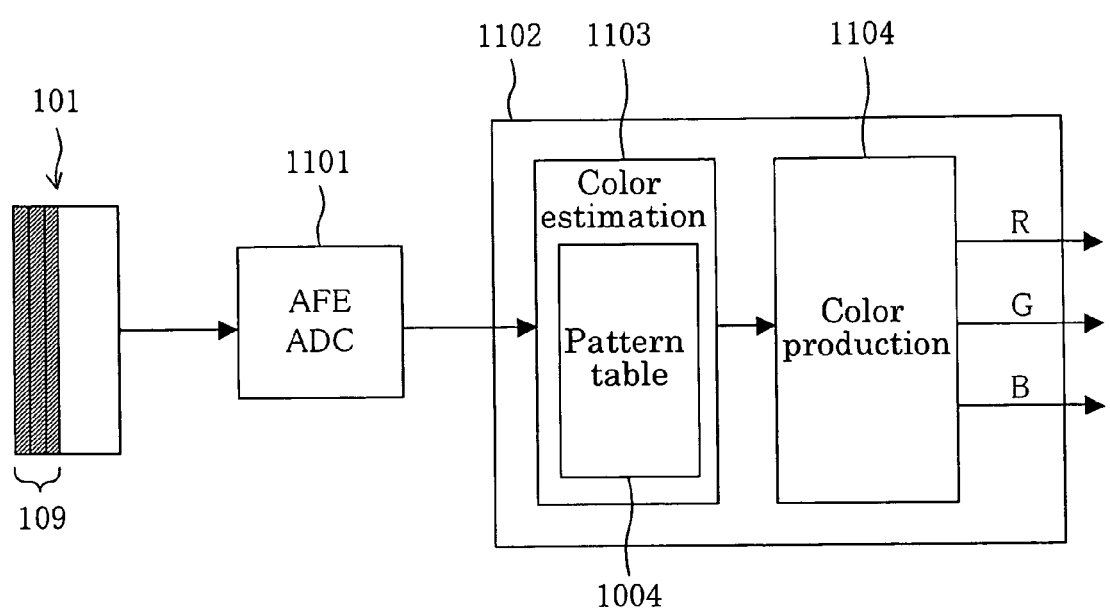
FIG. 12 is a diagram showing the overall structure of an image processing system according to an embodiment of the present invention.
Figure 14:
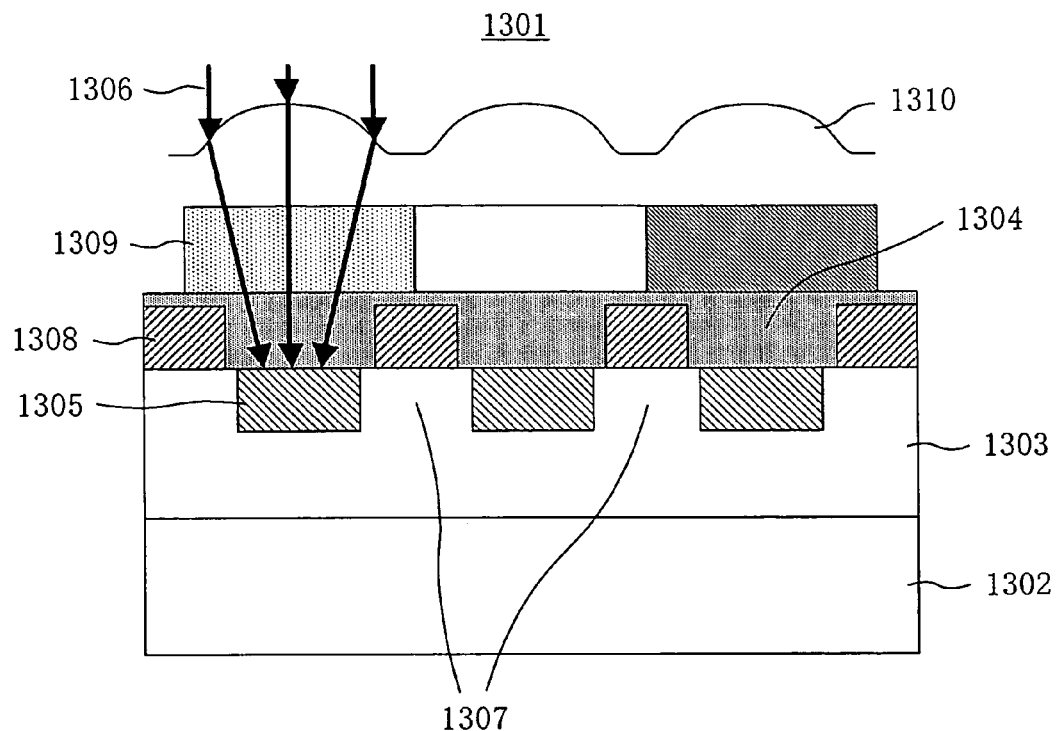
FIG. 14 is a cross-sectional view showing the structure of a known image pickup device.
Figure 15:
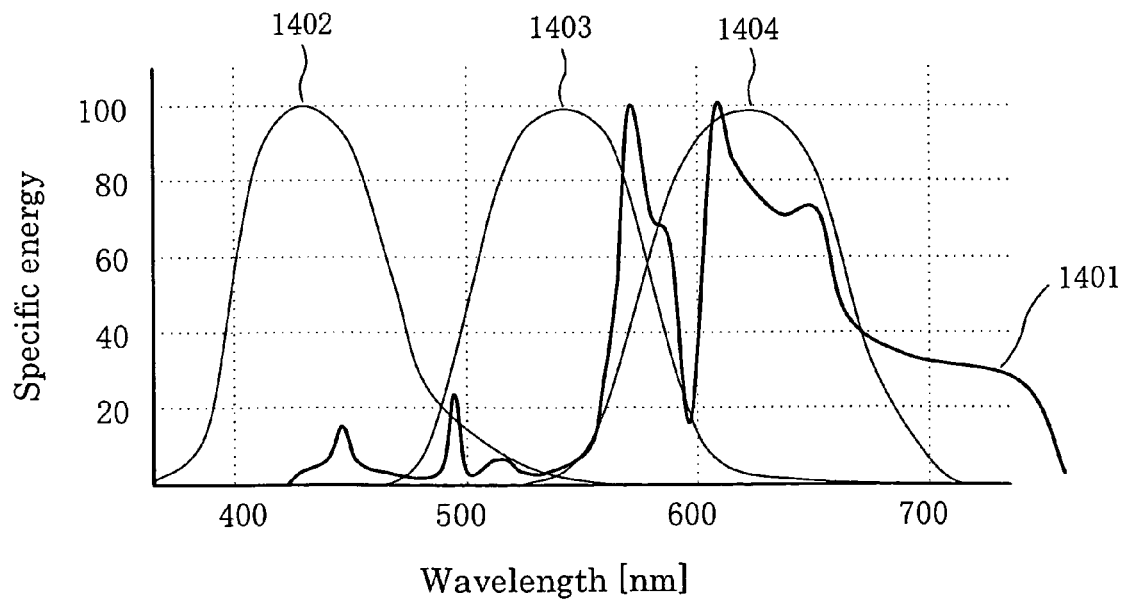
FIG. 15 is a graph showing the spectral characteristics of a high-pressure sodium lamp and the human eye.
Figure 16:
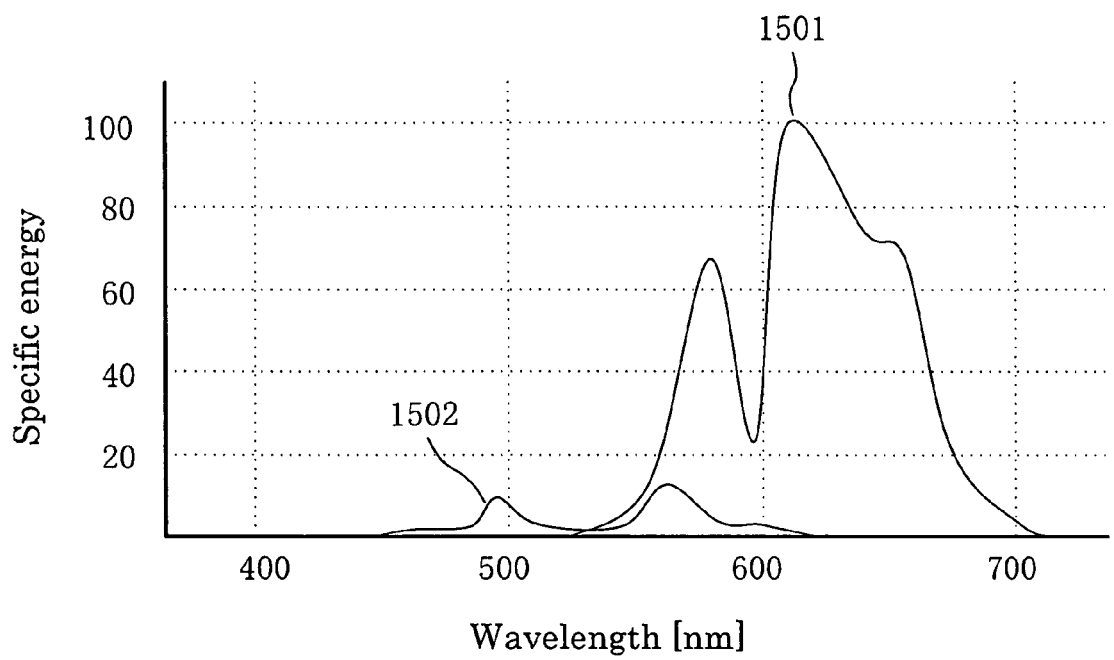
FIG. 16 is a graph showing the spectral characteristics of the human eye under the illumination of high-pressure sodium lamps.

FIG. 12 is a diagram showing the overall structure of an image processing system according to an embodiment of the present invention, wherein reference numeral 101 denotes an image sensor, reference numeral 109 denotes a multilayer film filter formed by depositing layers of inorganic materials and reference numeral 1101 denotes a unit including an analog front end (AFE) for processing an output signal of the image sensor 101 in an analog manner and an AD converter (ADC) for converting the analog signals to digital signals.

Reference numeral 1102 denotes an image processing LSI for processing a digitalized output signal of the image sensor 101 to produce desired image data.

Reference numeral 1103 denotes a color estimation section for estimating a color from the output signal of the image sensor 101. Specifically, the color estimation section 1103 uses the pattern table 1004 contained therein to estimate a color under white lighting from limited color information under the illumination of low color rendering lamps such as high-pressure sodium lamps.

Reference numeral 1104 denotes a color production section for producing desired color signals from the estimated color information. The output color signals are signals of three primary colors (R, G and B). Though in this embodiment the output color signals are three primary color signals, the output color signals may be other format signals such as color difference signals.

Though in this embodiment color estimation is made based on color information under the illumination of high-pressure sodium lamps, it goes without saying that, for example, color estimation can be made in the similar manner even using other low color rendering light sources having different spectral characteristics. Furthermore, though in this embodiment six types of filter elements are used, a larger number of types of filter elements may be used to further detailed spectral pattern information.

FIG. 13 is a diagram showing an exemplary array of filter elements of the multilayer film filter on the image sensor of this embodiment. As generally known, human have the highest visibility to the green (G) component and, therefore, information on the green component most contributes to human sense of resolution. As also known, the human eye is sensitive to resolutions of vertical and horizontal images but relatively gross to resolutions of tilt images. In view of these circumstances, it can be considered that a staggered arrangement of filters for the green component is effective to enhance the sense of resolution.

Therefore, in arraying a plurality of filter elements 601-606 of six types having different spectral characteristics, it is preferable to initially stagger green transmissive filter elements 603 and 604 for selectively transmitting the greenest color from row to row.

Since, however, the number of filter element types is six, the filter array has a 3×2 matrix pattern. In this case, when the green transmissive filter elements are staggered, parallel rows of spaces each corresponding to the width of one pixel are created between horizontally adjacent groups of staggered filter elements so that the green transmissive filter elements are sparse in the rows of spaces. Therefore, filter elements 602 and 605 for selectively transmitting the second greenest color are arranged in the rows of spaces.

Then, finally, filter elements 601 and 606 are arranged in the remaining positions. Note that this filter array is merely an example based on the concept of giving importance to resolution and other filter arrays can also be employed.

As described so far, the present invention provides a highly practical effect of improving color discrimination capability under the illumination of low color rendering lamps compared to the naked eye. Therefore, the present invention is very useful and has high industrial applicability. In particular, the present invention can be utilized as a vehicle-mounted image pickup device for monitoring video images around a vehicle for visual recognition.

What is claimed is:

1. An image processing system comprising:
an image sensor in which a plurality of unit pixels are arrayed on a chip, said image sensor comprising a filter for dividing a wavelength range of a spectral characteristic to each of a blue component, a green component and a red component of incident light into two or more portions and separating the incident light into six or more color components;
a conversion section for converting signals corresponding to the six or more color components separated by the image sensor to digital signals, respectively; and
an image processing section for processing the signals output from the conversion section to produce color signals, wherein:
the image processing section is configured to produce color signals over the entire human visible wavelength range based on information about two or more colors obtained by the image sensor even if there is no color information on an object over the entire human visible wavelength range, and
all of spectral bandwidths of the six or more color components are narrower than a spectral bandwidth of a human eye with respect to each of said blue component, said green component, and said red component.

2. The image processing system of claim 1, wherein the filter comprises a plurality of filter elements of at least four types, and
the plurality of filter elements are arrayed on the image sensor so that out of the plurality of filter elements, green transmissive filter elements for selectively transmitting the greenest color are staggered from row to row and another type of filter elements for selectively transmitting the second greenest color are disposed in positions of the filter array which are created by the staggered arrangement of the green transmissive filter elements and where the green transmissive filter elements are sparse.

3. The image processing system of claim 1, wherein the image processing section is configured to estimate colors of an object under white lighting based on information about two or more colors obtained by the image sensor even if there is no color information on the object over the entire human visible wavelength range, and produce color signals based on the estimation results.

4. The image processing system of claim 3, wherein
the image processing section includes a pattern table showing the relation between color information on an object under low color rendering lighting that is any one of the blue component, the green component and the red component having a narrow wavelength range and color information on the same object under white lighting, and the image processing section is configured to estimate color information of the object under white lighting from the object under low color rendering lighting based on the pattern table.

5. The image processing system of claim 1, wherein the image processing section is formed of a semiconductor LSI chip.

* * * * *